United States Patent
Ersoz et al.

(10) Patent No.: US 10,884,086 B1
(45) Date of Patent: Jan. 5, 2021

(54) SYSTEMS AND METHODS FOR ACCELERATED MULTI-CONTRAST PROPELLER

(71) Applicant: GE Precision Healthcare LLC, Wauwatosa, WI (US)

(72) Inventors: Ali Ersoz, Waukesha, WI (US); Ajeetkumar Gaddipati, Waukesha, WI (US); Dawei Gui, Waukesha, WI (US); Valentina Taviani, Menlo Park, CA (US); Zachary W Slavens, Waukesha, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 57 days.

(21) Appl. No.: 16/525,161

(22) Filed: Jul. 29, 2019

(51) Int. Cl.
 *G01R 33/48* (2006.01)
 *G01R 33/561* (2006.01)

(52) U.S. Cl.
 CPC ....... *G01R 33/482* (2013.01); *G01R 33/5612* (2013.01)

(58) Field of Classification Search
 CPC .................. G01R 33/482; G01R 33/5612
 See application file for complete search history.

(56) References Cited

U.S. PATENT DOCUMENTS

| 2010/0117645 | A1* | 5/2010 | Eggers | G01R 33/565 |
| | | | | 324/309 |
| 2014/0077813 | A1* | 3/2014 | Holmes | G01R 33/4824 |
| | | | | 324/322 |
| 2014/0091793 | A1* | 4/2014 | Guo | G01R 33/5611 |
| | | | | 324/309 |

OTHER PUBLICATIONS

L. Sun, et al; A deep Information Sharing Network for Multi-contrast Compressed Sensing MRI Reconstruction; Journal of Latex Class Files, vol. 14, No. 8, Aug. 2015, pp. 1-13.
Schlemper, et al; A Deep Cascade of Convolutional Neural Networks for Dynamic MR Image Reconstruction; IEEE Transactions on Medical Imaging, vol. 37, No. 2, Feb. 2018, pp. 491-503; United States.

* cited by examiner

*Primary Examiner* — Gregory H Curran

(57) ABSTRACT

Systems and methods for accelerated multi-contrast PROPELLER are disclosed herein. K-space is sampled in a rotating fashion using a plurality of radially directed blades around a center of k-space. A first subset of blades is acquired for a first contrast and a second subset of blades is acquired for a second contrasts. The first subset of blades is combined with high frequency components of the second subset of blades to produce an image of the first contrast. And the second subset of blades are combined with high frequency components of the first subset of blades to produce an image of the second contrast.

22 Claims, 10 Drawing Sheets

SYSTEMS AND METHODS FOR ACCELERATED MULTI-CONTRAST PROPELLER

FIELD

This disclosure relates to Periodically Rotated Overlapping Parallel Lines with Enhanced Reconstruction (PROPELLER) for magnetic resonance imaging (MRI), and more particularly, to accelerated multi-contrast PROPELLER.

BACKGROUND

The PROPELLER (Periodically Rotated Overlapping Parallel Lines with Enhanced Reconstruction) technique was developed as a motion reduction MRI method, which samples k-space in a rotating fashion using a set of radially directed strips or "blades" around the center of k-space. Each blade is composed of multiple parallel phase encoding lines that can be collected using spin echo or gradient echo methods. The PROPELLER trajectory through k-space offers some unique advantages. Each blade passes through the k-space center, hence contrast information is well preserved even if k-space is undersampled in the angular direction. Oversampling in this region also provides redundancy of information, and thus the data for each new blade can be compared to the data from previous blades for consistency. If the patient moves between blades, the data for the second blade can be corrected (or even completely discarded) based on how anomalous its central information appears.

In clinical applications, an MM scan obtains images of the same anatomical section of different contrasts. Multi-contrast magnetic resonance (MR) images contain similar but not the same image structures. By comparing multiple contrast MR images in the same regions, radiologists can detect subtle abnormalities such as a developing tumor. As used herein, "contrast" refers to the differences in signal intensities on MR images of various tissues, such as water-based tissues, fat-based tissues, and fluids, due to differences in MR properties. For example, a proton density (PD)-weighted image reflects the difference in spin density of various tissues/fluids being analyzed. A T1-weighted image reflects the difference in relaxation time for the recovery of magnetization along the longitudinal direction. A T2-weighted image reflects the difference in relaxation time for the recovery of magnetization along the transverse direction. A short TI inversion recovery (STIR) image suppresses signals from fat. A fluid attenuated inversion recovery (FLAIR) image suppresses signals from fluid, and so on.

PROPELLER can be used for obtaining various contrasts, such as PD, T1-, T2-weighted images, etc., by performing several PROPELLER sequences with different scan parameters, such as different echo time (TE) and repetition time (TR). For example, for brain scan, usually T1-, T2-weighted, and T2-FLAIR images are required; for spine scan, T1-FLAIR, T2-weighted, and STIR are required; for musculoskeletal (MSK) scan, T1-, T2-, and PD-weighted images are required; and so on. It takes a long time to perform the scan for all desired contrasts one by one. It is generally desired to reduce scan time for multi-contrast images while maintaining good quality of PROPELLER.

SUMMARY

In one embodiment, the present disclosure provides a method for obtaining multi-contrast images through PROPELLER. The method comprises sampling k-space in a rotating fashion using a plurality of radially directed blades around a center of k-space. A first subset of blades is acquired for a first contrast and a second subset of blades are acquired for a second contrast. The method further comprises combining the first subset of blades and high frequency components of the second subset of blades to produce an image of the first contrast; and combining the second subset of blades and high frequency components of the first subset of blades to produce an image of the second contrast.

In another embodiment, the present disclosure provides a processing system. The processing system comprises a storage device storing instructions and a processor coupled to the storage device. When executing the instruction, the processor instructs an MM scanner to sample k-space in a rotating fashion using a plurality of radially directed blades around a center of k-space. A first subset of blades is acquired for a first contrast and a second subset of blades are acquired for a second contrast. The processor also combines the first subset of blades and high frequency components of the second subset of blades to produce an image of the first contrast and combines the second subset of blades and high frequency components of the first subset of blades to produce an image of the second contrast.

BRIEF DESCRIPTION OF THE DRAWINGS

Various aspects of this disclosure may be better understood upon reading the following detailed description and upon reference to the drawings in which.

Figure 1:
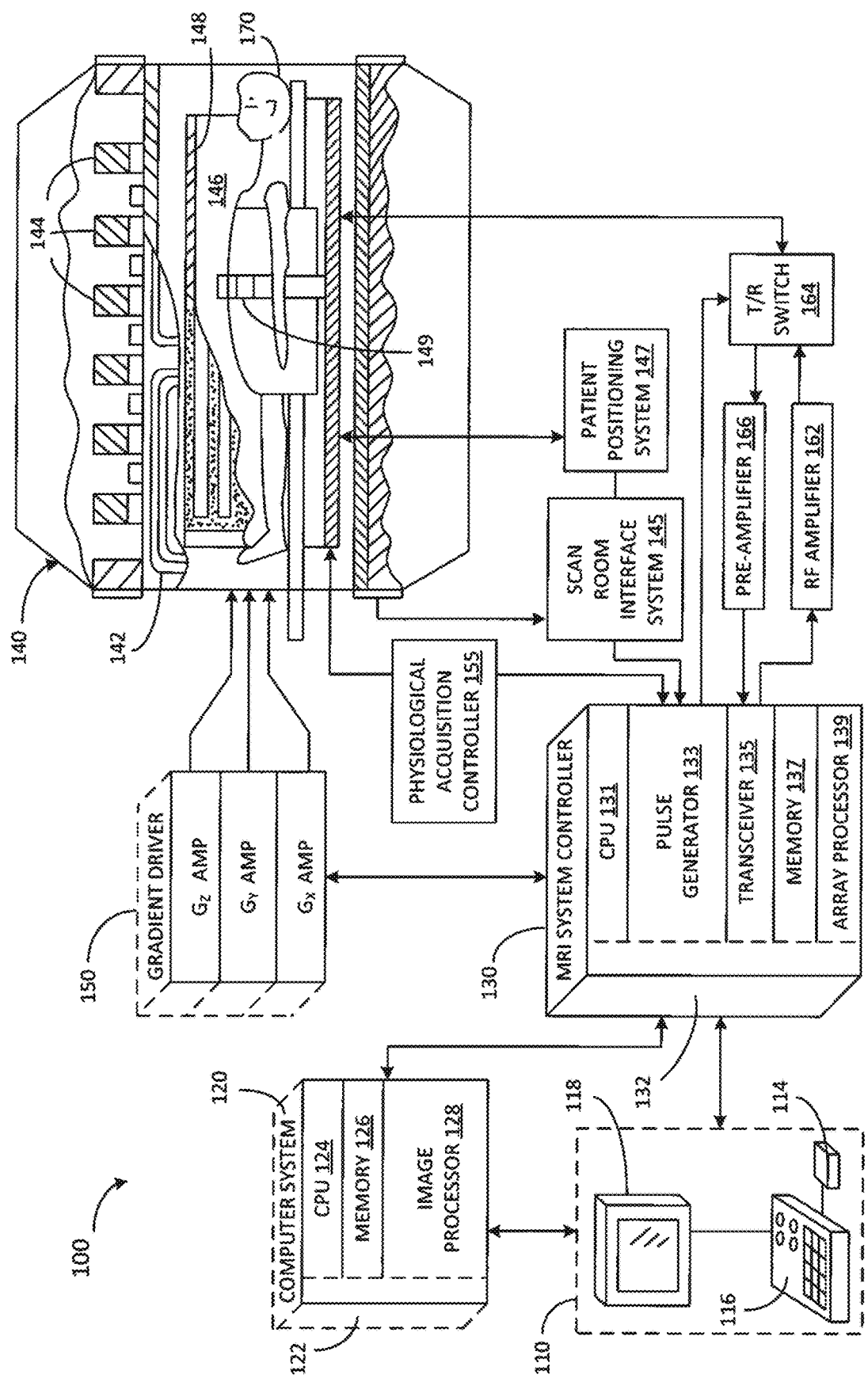
FIG. 1 is a schematic diagram of a magnetic resonance imaging (MRI) system, in accordance with an exemplary embodiment.

The drawings illustrate specific aspects of the described components, systems and methods for obtaining multi-contrast images by using accelerated PROPELLER. Together with the following description, the drawings demonstrate and explain the principles of the structures, methods, and principles described herein. In the drawings, the thickness and size of components may be exaggerated or otherwise modified for clarity. Well-known structures, materials, or operations are not shown or described in detail to avoid obscuring aspects of the described components, systems and methods.

DETAILED DESCRIPTION

One or more specific embodiments of the present disclosure are described below in order to provide a thorough understanding. These described embodiments are only examples of the systems and methods for obtaining multi-contrast images by using accelerated PROPELLER. The skilled artisan will understand that specific details described in the embodiments can be modified when being placed into practice without deviating the spirit of the present disclosure.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. In addition, it should be understood that references to "one embodiment" or "an embodiment" of the present disclosure are not intended to be interpreted as excluding the existence of additional embodiments that also incorporate the recited features.

Referring to the figures generally, the present disclosure describes systems and methods for acquiring multi-contrast images by using accelerated PROPELLER. A PROPELLER sequence samples k-space in a rotating fashion using a set of radially directed strips or "blades" around the center of k-space. Each blade is composed of multiple parallel phase encoding lines that can be collected using spin echo or gradient echo methods. The oversampled center of k-space provides redundancy of information, so that the data for each new blade can be compared to the data from previous blades for consistency. In current approaches, various contrasts (e.g., T1-, T2-, PD-weighted, FLAIR, etc.) can be acquired by performing several PROPELLER sequences with different parameters, such as different echo time (TE) and repetition time (TR). It takes a long time to perform the scan for all desired contrasts one by one.

In an exemplary method of the present disclosure, k-space is sampled in a rotating fashion using a plurality of blades around the center of k-space. Among the plurality of blades, a first subset of blades is acquired with scan parameters according to a first contrast and a second subset of blades are acquired with scan parameters according to a second contrast. The first subset of blades and the high-frequency portion of the second subset of blades are combined to produce an image of the first contrast. The low-frequency portion of k-space located in the middle area of k-space mainly contains the contrast information, while the high-frequency portion of k-space location at the peripheral area of k-space mainly contains the structural details of the anatomy (e.g., the tissue boundaries). By removing the low-frequency portion of the second subset of blades from the reconstruction, information of the second contrast is not included in the image of the first contrast. Similarly, the second subset of blades and the high-frequency portion of the first subset of blades are combined to produce an image of the second contrast.

Referring now to FIG. 1, a schematic diagram of an exemplary MRI system 100 is shown in accordance with an exemplary embodiment. The operation of MRI system 100 is controlled from an operator workstation 110 which includes an input device 114, a control panel 116, and a display 118. The input device 114 may be a joystick, keyboard, mouse, track ball, touch activated screen, voice control, or any similar or equivalent input device. The control panel 116 may include a keyboard, touch activated screen, voice control, buttons, sliders, or any similar or equivalent control device. The operator workstation 110 is coupled to and communicates with a computer system 120 that enables an operator to control the production and viewing of images on display 118. The computer system 120 includes a plurality of components that communicate with each other via electrical and/or data connections 122. The computer system connections 122 may be direct wired connections, fiber optic connections, wireless communication links, or the like. The computer system 120 may include a central processing unit (CPU) 124, a memory 126, and an image processor 128. In some embodiments, the image processor 128 may be replaced by image processing functionality implemented in the CPU 124. The computer system 120 may be connected to archival media devices, permanent or back-up memory storage, or a network. The computer system 120 is coupled to and communicates with a separate MRI system controller 130.

The MRI system controller 130 includes a set of components in communication with each other via electrical and/or data connections 132. The MRI system controller connections 132 may be direct wired connections, fiber optic connections, wireless communication links, or the like. The MRI system controller 130 may include a CPU 131, a pulse generator/sequencer 133 communicating with the operator workstation 110, a transceiver 135, a memory 137, and an array processor 139. In some embodiments, the pulse generator/sequencer 133 may be integrated into a resonance assembly 140 of the MRI system 100. The MRI system controller 130 may receive commands from the operator workstation 110 to indicate the MRI scan sequence to be performed during an MRI scan. The MRI system controller 130 is also coupled to and communicates with a gradient driver system 150, which is coupled to a gradient coil assembly 142 to produce magnetic field gradients during an MRI scan.

The pulse generator/sequencer 133 may also receive data from a physiological acquisition controller 155 which receives signals from a plurality of different sensors connected to an object or patient 170 undergoing an MM scan, such as electrocardiography (ECG) signals from electrodes attached to the patient. And finally, the pulse generator/sequencer 133 is coupled to and communicates with a scan room interface system 145, which receives signals from various sensors associated with the condition of the resonance assembly 140. The scan room interface system 145 is also coupled to and communicates with a patient positioning system 147, which sends and receives signals to control movement of a patient table to a desired position for an MRI scan.

The MRI system controller 130 provides gradient waveforms to the gradient driver system 150, which includes, among others, $G_X$, $G_Y$ and $G_Z$ amplifiers. Each $G_X$, $G_Y$ and $G_Z$ gradient amplifier excites a corresponding gradient coil in the gradient coil assembly 142 to produce magnetic field gradients used for spatially encoding MR signals during an MRI scan. The gradient coil assembly 142 is included within the resonance assembly 140, which also includes a superconducting magnet having superconducting coils 144, which in operation, provides a homogenous longitudinal magnetic field $B_0$ throughout a cylindrical imaging volume 146 that is enclosed by the resonance assembly 140. The resonance assembly 140 also includes a RF body coil 148 which in operation, provides a transverse magnetic field $B_1$ that is generally perpendicular to $B_0$ throughout the open cylindrical imaging volume 146. The resonance assembly 140 may also include RF surface coils 149 used for imaging different anatomies of a patient undergoing an MM scan. The RF body coil 148 and RF surface coils 149 may be configured to operate in a transmit and receive mode, transmit mode, or receive mode.

An object or patient 170 undergoing an MRI scan may be positioned within the cylindrical imaging volume 146 of the resonance assembly 140. The transceiver 135 in the MRI system controller 130 produces RF excitation pulses that are amplified by an RF amplifier 162 and provided to the RF body coil 148 through a transmit/receive switch (T/R switch) 164.

As mentioned above, RF body coil 148 and RF surface coils 149 may be used to transmit RF excitation pulses and/or to receive resulting MR signals from a patient undergoing an MRI scan. The resulting MR signals emitted by excited nuclei in the patient undergoing an MRI scan may be sensed and received by the RF body coil 148 or RF surface coils 149 and sent back through the T/R switch 164 to a pre-amplifier 166. The amplified MR signals are demodulated, filtered and digitized in the receiver section of the transceiver 135. The T/R switch 164 may be controlled by a signal from the pulse generator/sequencer 133 to electrically connect the RF amplifier 162 to the RF body coil 148 during the transmit mode and connect the pre-amplifier 166 to the RF body coil 148 during the receive mode. The T/R switch 164 may also enable RF surface coils 149 to be used in either the transmit mode or receive mode.

The resulting MR signals sensed and received by the RF body coil 148 or RF surface coils 149 are digitized by the transceiver 135 and transferred to the memory 137 in the MRI system controller 130.

An MR scan is complete when an array of raw k-space data, corresponding to the received MR signals, has been acquired and stored temporarily in the memory 137 until the data is subsequently transformed to create images. This raw k-space data is rearranged into separate k-space data arrays for each image to be reconstructed, and each of these separate k-space data arrays is input to the array processor 139, which operates to Fourier transform the data into arrays of image data.

The array processor 139 uses a transformation method, most commonly a Fourier transform, to create images from the received MR signals. These images are communicated to the computer system 120 where they are stored in memory 126. In response to commands received from the operator workstation 110, the image data may be archived in long-term storage or it may be further processed by the image processor 128 and conveyed to the operator workstation 110 for presentation on the display 118.

In various embodiments, the components of computer system 120 and MRI system controller 130 may be implemented on the same computer system or a plurality of computer systems.

Figure 2A:
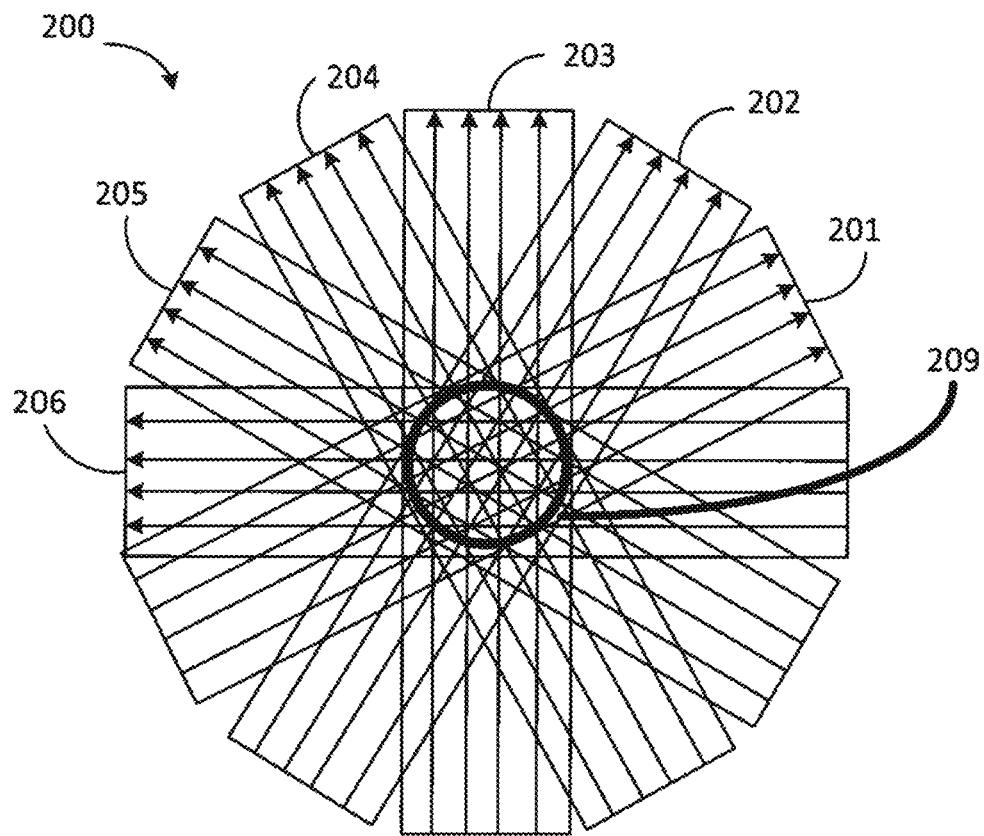
FIG. 2A schematically illustrates a plurality of blades of k-space data acquired according to the PROPELLER technique.
Figure 2B:
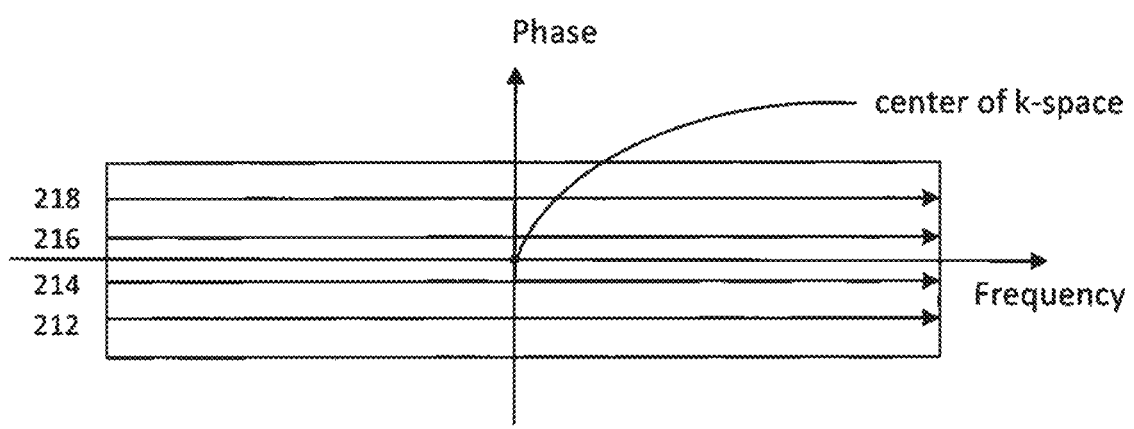
FIG. 2B schematically illustrates one of the blades shown in FIG. 2A.

Referring to FIGS. 2A and 2B, the PROPELLER technique is illustrated schematically. PROPELLER collects (or "samples") data in k-space 200 using a plurality of overlapping blades (or "strips") 201, 202, 203, 204, 205, and 206, arranged in a rotational manner relative to the center of k-space 200. FIG. 2A shows six blades (201-206) in a rotating fashion for illustration. An individual blade is shown in FIG. 2B. The blades 201-206 are successively rotated in k-space 200 by an incremental angle so that the total data set spans a circle in k-space 200. In some embodiments, the incremental angle is in the range of 10°-20°. Each blade covers a rectangular region of k-space with a geometry center co-localized with the center of k-space. The size (width and length) of the blades is the same. Each blade consists of a group of several parallel linear trajectories (or "spokes"). FIG. 2B shows four parallel lines (212-218) for illustration. In some embodiments, each blade consists of 8-32 parallel lines. Each blade has its own frequency-encoding direction (or "readout direction") and phase-encoding direction.

Phase encoding lines (e.g., 212-218) in each blade may be collected using a variety of methods. In some embodiments, the phase encoding lines in one blade are collected with a single excitation radio frequency (RF) pulse and multiple readouts (e.g., Fast/Turbo spin echo (FSE/TSE) sequence or partial echo-planar sequence). In some embodiments, the phase encoding lines in a blade are acquired with a series of excitation RF pulses (e.g., fast gradient echo sequence). The blade is then rotated by the incremental angle (e.g., 10°-20°) to the position of the next blade, where another set of k-space data are acquired. The process continues until data from the entire k-space circle has been collected.

As can be seen, in PROPELLER, the center of k-space is oversampled and continuously updated due to the overlapping "spokes" that repeatedly pass through this region. This redundancy can be exploited to detect and correct for movement if the signal from the k-space center changes between views. Additionally, all radial spokes make equal contributions to the image (unlike Cartesian sampling where just a few lines through the center of k-space set overall image contrast). Noise from moving anatomic structures thus does not propagate as discrete ghosts along a single phase-encoding direction, but is distributed more diffusely across the entire image. Therefore, motion on just one or a few radial views is not likely to severely degrade image quality.

Figure 3:
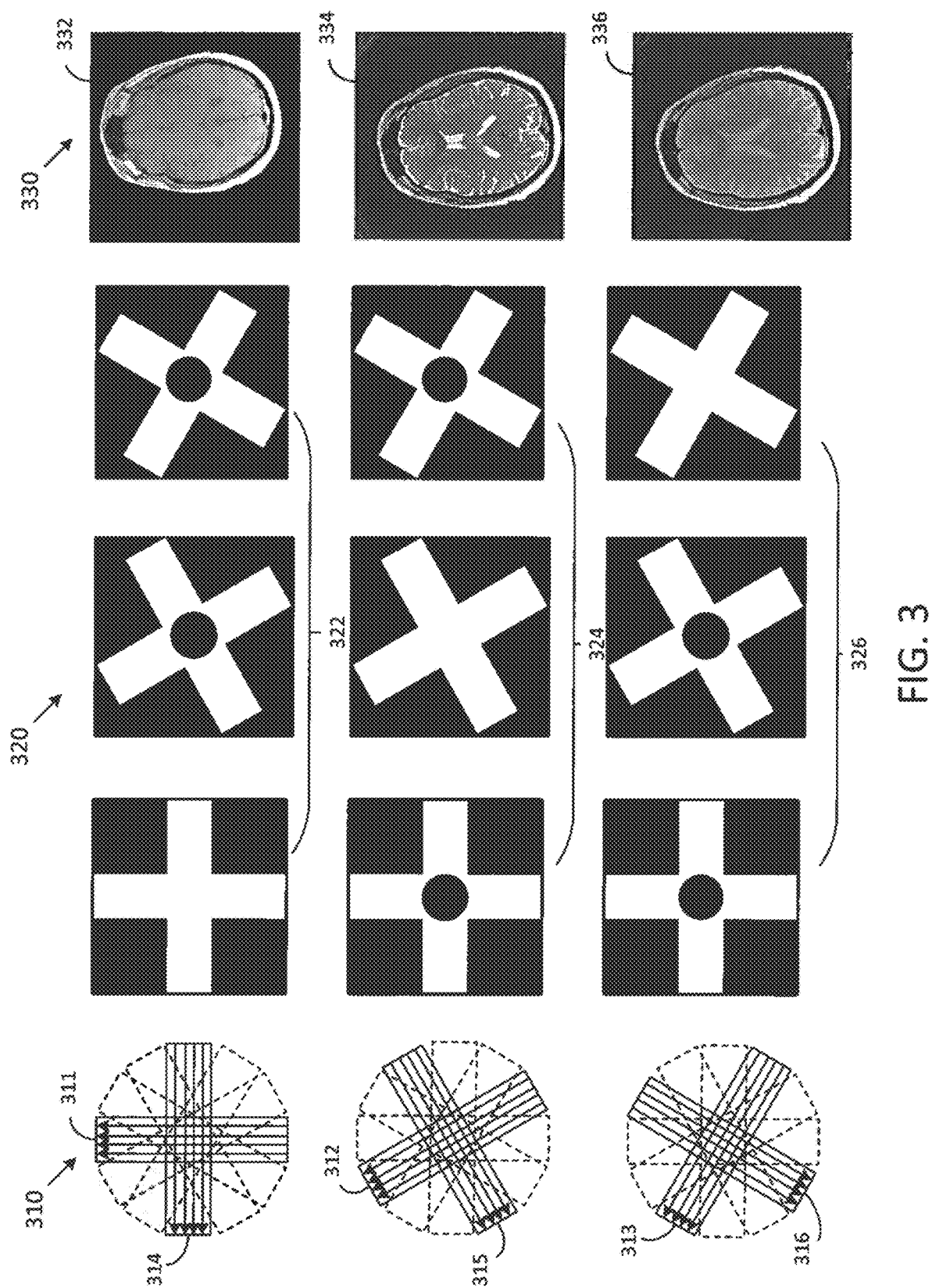
FIG. 3 is a schematic diagram illustrating the process of obtaining multi-contrast images by using accelerated PROPELLER, in accordance with an exemplary embodiment.

Referring to FIG. 3, a schematic diagram illustrating a process for obtaining multi-contrast images by using accelerated PROPELLER is shown, according to an exemplary embodiment. At 310, blades for various contrasts are acquired. FIG. 3 shows three contrasts for illustration. It should be understood that the number of contrasts may be any appropriate number (e.g., 2, 3, 4, 5, etc.). For the first contrast (e.g., T1-weighted), k-space data are collected using a first subset of blades (311, 314). For the second contrast (e.g., T2-weighted), k-space data are collected using a second subset of blades (312, 315). For the third contrast (e.g., PD-weighted), k-space data are collected using a third subset of blades (313, 316). For each contrast, the k-space is undersampled. The combination of the three subsets of blades covers the full k-space. In other words, the three subsets of blades for three contrasts are complementary. In some embodiments, the multiple subsets of blades are arranged in k-space in an alternating manner. For example, blade 311 is for the first contrast, blade 312 which is rotated by an incremental angle with respect to blade 311 is for the second contrast, blade 313 which is rotated by an incremental angle with respect to blade 312 is for the third contrast, and so on.

In some embodiments, multiple subsets of blades for multiple contrasts are acquired by using different scan parameters (e.g., TE and TR). For example, short TR and short TE may be used to enhance the T1 differences between tissues. Long TR and long TE may be used for T2-weighted contrast. Long TR and short TE are used for PD-weighted contrast. TE and TR do not change among the same subset of blades for one contrast. In some embodiments, the scan parameters are set according to the first contrast and all blades for the first contrast are collected. Then the scan parameters are changed according to the second contrast and all blades for the second contrast are collected followed by the change of scan parameters according to the third contrast and collection of all blades for the third contrast. In some embodiments, the scan parameters are set according to the first contrast and the first blade in the subset for the first contrast is collected. Then the scan parameters are changed according to the second contrast and the first blade in the subset for the second contrast is collected. Then the scan parameters are changed according to the third contrast and the first blade in the subset for the third contrast is collected. Then the scan parameters are changed back according to the first contrast and the second blade in the subset for the first contrast is collected, and so on. In PROPELLER, the collected data are pre-processed for motion correction. Process of motion correction is discussed in more detail below with reference to FIG. 4.

At 320, k-space data collected with the three subsets of blades are selectively combined. Data from the middle area of k-space (i.e., low spatial frequency components) mainly contain the contrast information but very limited structural details of the anatomy (e.g., the tissue boundaries). Data from the peripheral area of k-space (i.e., high spatial frequency components) mainly contain information of the structural details but very limited contrast information. The k-space data in the three subsets of blades are combined differently to produce images of different contrasts. In the first configuration 322, the first subset of blades and the high frequency components of the second and third subsets of blades are combined. In some embodiments, three masks are used—the first mask is applied to the first subset of blades which allows both high frequency and low frequency components to be included. The second mask is applied to the second subset of blades so that the low frequency components in the middle area of k-space is removed while the high frequency components in the peripheral area remain. The third mask is applied to the third subset of blades so that the middle area of the k-space is removed while the high frequency components in the peripheral area remain. As a result, only the first contrast information contained in the middle of the first subset of blades, not the second or third contrast information in the middle of the second and third subsets of blades are used for reconstruction. High frequency information contained in the peripheral of all blades are used. When the combined k-space data is reconstructed in the image space, an image 332 of the first contrast is produced.

In the second configuration 324, the second subset of blades and the high frequency components of the first and third subsets of blades are combined. When the combined k-space data is reconstructed in the image space, an image 334 of the second contrast is produced. In the third configuration 326, the third subset of blades and the high frequency components of the first and second subsets of blades are combined. When the combined k-space data is reconstructed in the image space, an image 336 of the third contrast is produced. Further Details will be discussed below with reference to FIGS. 5-6.

Figure 4:
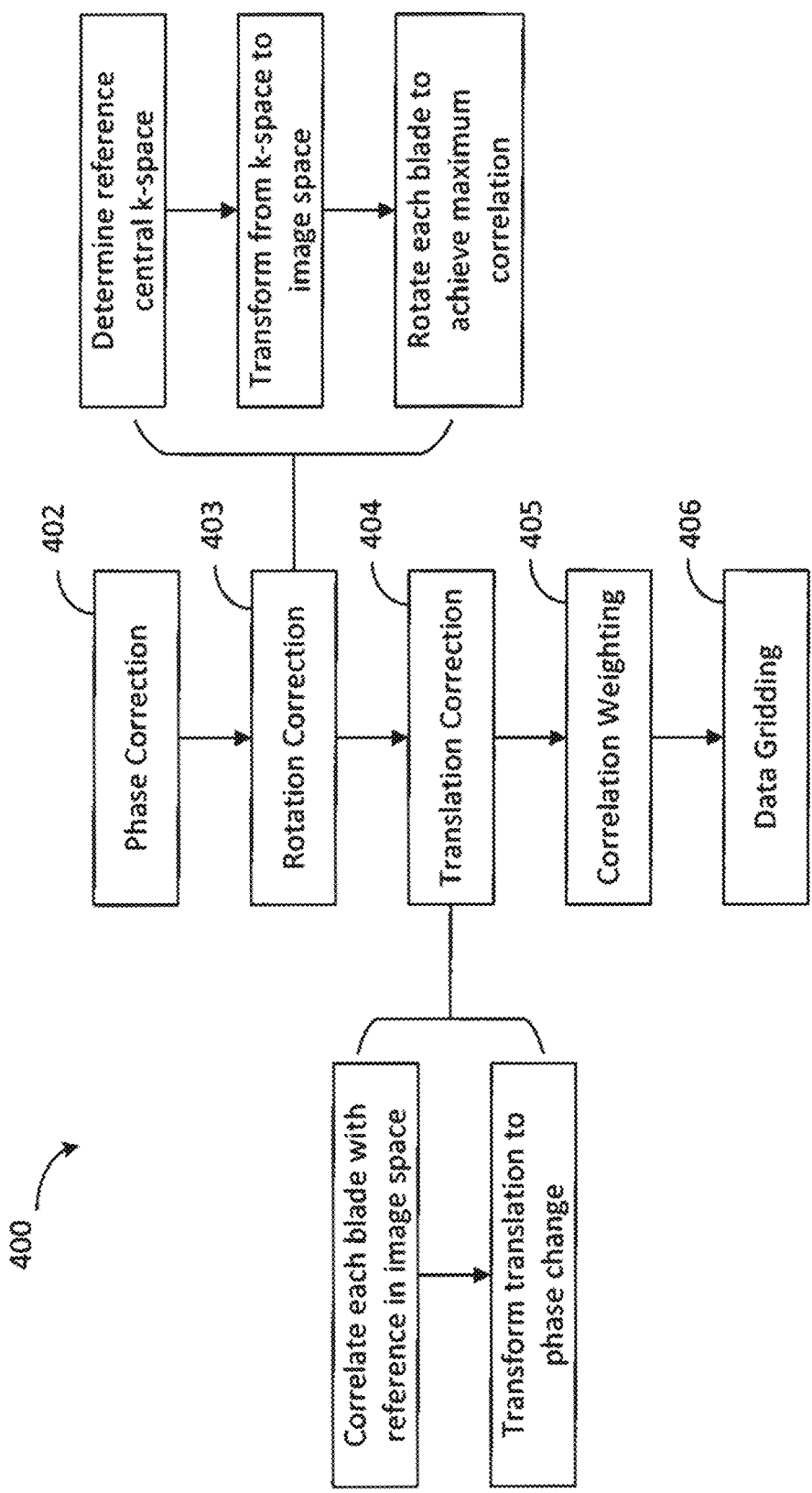
FIG. 4 is a flow chart of a method for pre-processing k-space data acquired by accelerated PROPELLER, in accordance with an exemplary embodiment.

Referring to FIG. 4, a flow chart of a method 400 for pre-processing k-space data collected by accelerated PROPELLER is shown, in accordance with an exemplary embodiment. The purpose of pre-processing is motion correction. Patient motion is known to produce artifacts in MR images. These artifacts can arise because of tissue displacement during the quiescent period between each data sampling period and the following excitation RF, as well as between an excitation RF pulse and the subsequent data sampling period.

At 402, phase correction is performed, which is to make sure that the point of rotation between blades is the center of k-space. Due to imperfect gradient balancing along the readout direction and eddy currents, the point around which blades rotate might not be the center of k-space. This displacement of k-space center would result in a linear phase variation in image space for each of the blade. Since phase correction can be done within each blade, current methods of phase correction for blades of the same contrast can be applied similarly to blades for different contrasts. For example, each blade is windowed by a pyramid function. The windowed data and the original data are transformed (e.g., by Fourier Transform) to image space, respectively. The resulting phase of the image space data transformed from the windowed data is removed from that of the image space data transformed from the original data. And then the corrected image space data is transformed back (e.g., by inverse Fourier Transform) to k-space to correct that blade.

At 403 and 404, rotation correction and translation correction are performed, respectively, to correct motion between blades. In PROPELLER, motion correction for objects such as a human head is a rigid body registration problem. Any in-plane motion of a rigid body is geometrically equivalent to a rotation about the center of the image and a linear translation. Hence, in-plane rigid body motion correction can be separated into a rotation correction and a translation correction. Rotation of the object around the center of the image space is equivalent to rotation of the k-space representation of the object around the k-space center, whereas translation of the object in image space is equivalent to a linear phase change in the k-space representation of the object. As can be seen from FIGS. 2A and 2B, a central circle 209 in k-space with a diameter equal to the width of each blade is resampled for each blade. Since all blades share the central circle 209 of k-space, rotation and translation between blades can be estimated using the central circle 209.

In particular, estimation of the rotation of the object between two blades is equivalent to estimating the rotation in the data of the central circle 209 of k-space from the two blades. Estimation of rotation of the central circle 209 can be achieved by estimating the rotation in the magnitude data of the central circle 209 from the two blades. Current methods of rotation correction for blades of the same contrast can be applied similarly to blades for different contrasts with some adjustment. In particular, a set of Cartesian coordinates that spans the central circle 209 of k-space is defined. The data magnitude of each blade inside this circle is gridded onto the Cartesian coordinates. The average of all central circles from all acquired blades for different contrasts is taken as a reference central k-space. Then the central circle of each blade as well as the reference central k-space are transformed from k-space to image space. Then each individual blade orientation is rotated to achieve maximum correlation with the reference k-space in image space. After rotation correction, translation correction in frequency and phase encoding directions is performed in image space for all blades from all acquired contrasts by once again correlating images from the central circle of each blade with the image from the reference central k-space. Then the translation in image space is transformed to a linear phase change in k-space for each blade.

At 405, correlation weighting is performed. In PROPELLER, out-of-plane motion cannot be corrected. However, the effects of out-of-plane motion can be minimized by assigning lower weights to blades affected by out-of-plane motion based on correlation to the reference central k-space obtained from averaging central circles of all blades.

At 406, k-space data from all the blades for various contrasts are gridded onto a set of Cartesian coordinates defined for k-space.

Figure 5:
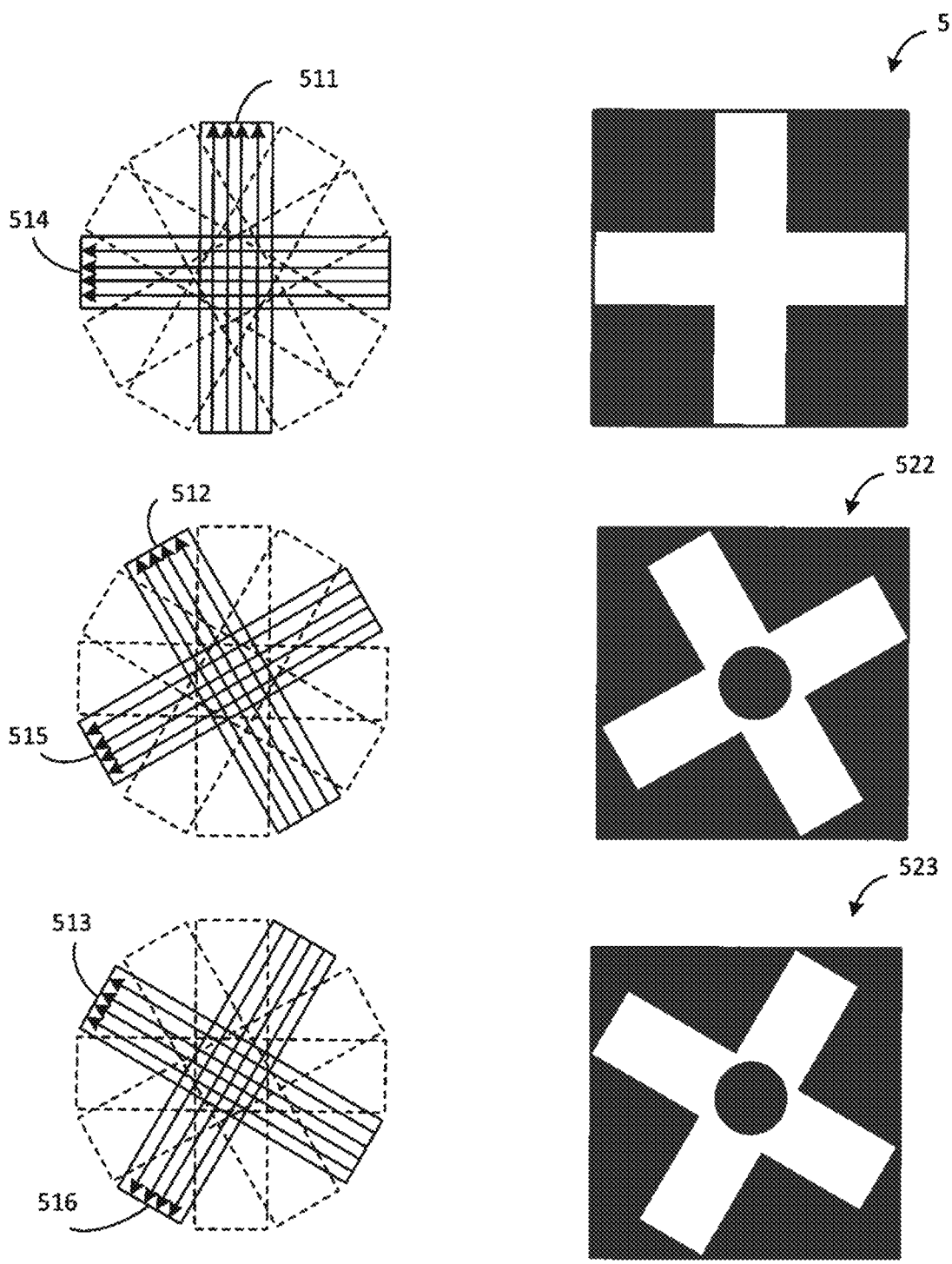
FIG. 5 is a schematic diagram showing masks applied to corresponding PROPELLER blades for various contrasts, in accordance with an exemplary embodiment.

Referring to FIG. 5, a schematic diagram illustrating combination of subsets of blades for different contrasts is shown, according to an exemplary embodiment. Although three contrasts are used in FIG. 5 as an example for illustration, it should be understood that the method applies to any appropriate number of contrasts. Assume that blades 511 and 514 are acquired with scan parameters according to the first contrast (e.g., T1-weighted), blades 512 and 515 are acquired with scan parameters according to the second contrast (e.g., T2-weighted), and blades 513 and 516 are acquired with scan parameters according to the third contrast (e.g., PD-weighted). Multi-contrast images can be produced from these blades. For a final image of the first contrast, the first contrast is called the "main" contrast while the second and third contrasts are called the "supporting" contrasts. For a final image of the second contrast, the second contrast is the "main" contrast while the first and third contrasts are the "supporting" contrasts. For a final image of the third contrast, the third contrast is the "main" contrast while the first and second contrasts are the "supporting" contrasts.

The combination of k-space data from different subsets of blades for different contrasts may be solved as a minimization problem for a penalized weighted least squares cost function:

$$\min_u \left\{ \frac{\lambda_{main}}{2} \|A_{main} u - f_{main}\|_2^2 + \frac{\lambda_{s1}}{2} \|A_{s1} u - f_{s1}\|_2^2 + \frac{\lambda_{s2}}{2} \|A_{s1} u - f_{s2}\|_2^2 + R(u) \right\}, \quad (1)$$

wherein u is an estimated real-space image of the scanned object on the Cartesian grid. $A_{main}$ is an operator that maps the estimated image u of the object residing on the Cartesian grid to k-space samples on the PROPELLER blades for the main contrast (e.g., 511, 514). $A_{s1}$ is an operator that maps the estimated image u of the object residing on the Cartesian grid to k-space samples on the PROPELLER blades for the first supporting contrast (e.g., 512, 515). $A_{s2}$ is an operator that maps the estimated image u of the object residing on the Cartesian grid to k-space samples on the PROPELLER blades for the second supporting contrast (e.g., 513, 516). The mapping can be performed using nonuniform fast Fourier Transform (NUFFT). A method of NUFFT was described in "Nonuniform Fast Fourier Transforms Using Min-Max Interpolation," Fessler J A, et al., IEEE Trans Signal Proc 2003; 51: 560-573.

$f_{main}$ is the measured k-space samples on the blades for the main contrast (e.g., 511, 514). In other words, $f_{main}$ is the k-space data acquired using the blades for the main contrast. $f_{s1}$ is the measured k-space samples on the blades for the first supporting contrast (e.g., 512, 515); and $f_{s2}$ is the measured k-space samples on the blades for the second supporting contrast (e.g., 513, 516). As such, $\|A_{main} u - f_{main}\|$ represents the difference (or inconsistency) between the mapped k-space data and the acquired k-space data for the main contrast. $\|A_{s1} u - f_{s1}\|$ represents the difference between the mapped k-space data and the acquired k-space data for the first supporting contrast. $\|A_{s2} u - f_{s2}\|$ represents the difference between the mapped k-space data and the acquired k-space data for the second supporting contrast.

For the first and second supporting contrasts, the difference between the mapped k-space data and the measured k-space data in the middle area of k-space is not taken into account so that the supporting contrasts do not go into the final image of the main contrast. In some embodiments, the difference in the central circle 209 of k-space is removed (i.e., removed) by applying masks to various contrasts. For example, a mask 522 is applied to $\|A_{s1} u - f_{s1}\|$ so that the difference in the central disc portion of the mask is set to a value of "0" while the difference outside of the central disc portion remains. A similar mask 523 is applied to $\|A_{s2} u - f_{s2}\|$ so that the difference in the central disc portion of the mask is set to a value of "0" while the difference outside of the central disc portion remains. An optional mask 521 is applied to $\|A_{main} u - f_{main}\|$ but not really removes any differences for the main contrast.

$\lambda_{main}$ is the coefficient (or "weight") for the difference between the mapped k-space data and the acquired k-space data for the main contrast. $\lambda_{s1}$ and $\lambda_{s2}$ are the coefficients for the difference between the mapped k-space data and the acquired k-space data of the first and second supporting contrasts, respectively. In some embodiments, the coefficients are pre-defined based on experiments or models. For example, $\lambda_{main}$ may be set to a value of "1" while $\lambda_{s1}$ and $\lambda_{s2}$ may be set to a value of "0.2" to reflect that the difference for the main contrast is weighted more than the difference for the supporting contrasts. In some embodiments, the coefficients are learned through training a deep neural network, which will be explained in further detail with reference to FIGS. 6A-6C.

R(u) is a quadratic regularization function that penalizes the roughness of the estimated image u. In some embodiments, R(u) is given by the summation, over all pixels/voxels in the image, of the sum of squared intensity differences between a pixel and its 4 neighboring pixels or between a voxel and its 8 neighboring pixels. In some embodiments, R(u) may have a coefficient to control the extent of influence of R(u) on the cost function (1).

In some embodiments, minimization of the above cost function (1) may be iteratively solved by analytical methods. In particular, in the first iteration, the estimated image u is obtained by Fourier transforming a blade for the main contrast with zero filling. Then the difference of mapped k-space data and acquired k-space data is calculated for each blade, and masked, weighted, and combined as discussed above. The combined difference in k-space data is then transformed back to the image space and used to correct the estimated image u with the regularization function R(u). The iteration goes on until a pre-defined number of iterations are performed or a desired convergence is achieved.

Figure 6A:
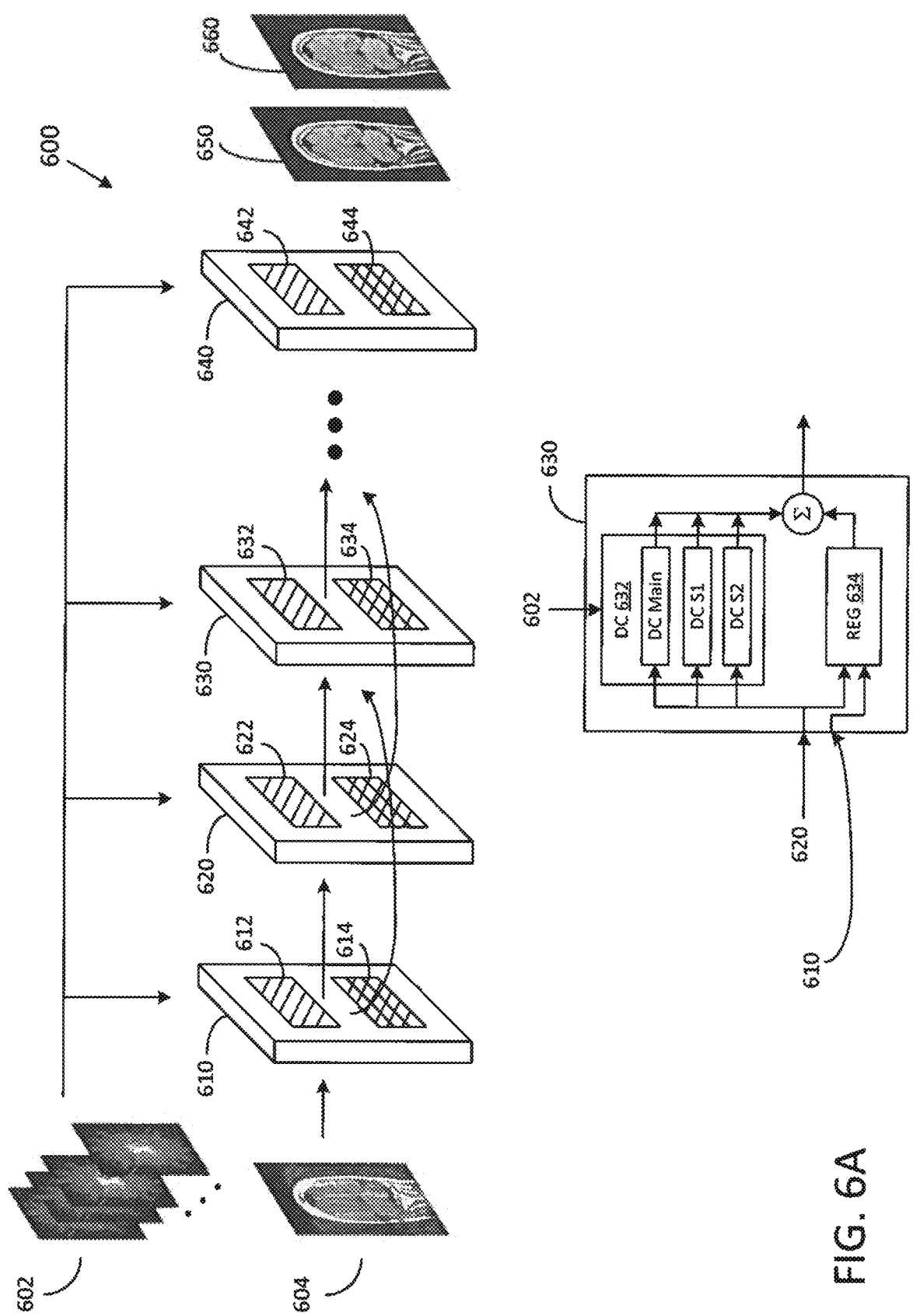
FIG. 6A is a schematic diagram of a deep neural network for reconstructing multi-contrast PROPELLER images, in accordance with an exemplary embodiment.

In some embodiments, minimization of the cost function (1) may be solved by using a deep neural network. Referring to FIG. 6A, a schematic diagram of a deep neural network 600 for reconstructing multi-contrast PROPELLER images is shown, in accordance with an exemplary embodiment. FIG. 6A shows a densely connected iterative network (DCI-Net) as an example of the deep neural network for illustration. It should be understood that any appropriate type of deep neural network can be used. The network 600 includes a plurality of iterative blocks 610, 620, 630, and 640. Although four iterative blocks are shown here for illustration, it should be understood that any appropriate number of iterative blocks (e.g., 5, 10, 20, 30, etc.) can be used to form the network 600. The first iterative block 610 receives the blades 602 acquired by accelerated PROPELLER as an input. The blades 602 consist of multiple subsets of blades for various contrasts as described above. For example, the blades 602 may consist of a subset of blades for the main contrast and two subsets of blades for the first and second supporting contrasts, as shown in FIG. 5. The first iterative block 610 also receives an initial undersampled image 604 as an input. In some embodiments, the image 604 is produced by Fourier transforming a blade for the main contrast with zero-filling.

The first iterative block 610 generates a first iterative block output based on the initial undersampled image 604 and the blades 602 acquired by accelerated PROPELLER. The second iterative block 620 receives the first iterative block output as a direct input. The second iterative block 620 generates a second iterative block output based on the first iterative block output and the acquired blades 602. The third iterative block 630 receives the second iterative block output as a direct input and also, receives the first iterative block output as a skip input. Direct connections between adjacent iterative blocks are represented as straight lines in FIG. 6A while skip connections between non-adjacent iterative blocks are represented as curved lines. The first iterative block output is input to the following G iterations (e.g., G=3, 4, 5, etc.). G is called the growth rate, which regulates how much new information each block contributes to the global state. The third iterative block 630 also receives the acquired blades 602 and generates a third iterative block output based on the second iterative block output (through a direct connection), as well as the first iterative block output (through a skip connection) and the acquired blades 602. The final iterative block 640 generates a final output 650 based on an iterative block output through a direct connection from its adjacent preceding iterative block (not shown), as well as G iterative block outputs through skip connections from iterative block preceding that adjacent preceding iterative block and acquired blades 602. If the network 600 is at a training stage, the final output 650 is compared with a ground truth 660 and the inconsistency between 650 and 660 is back projected to adjust the parameters of the network 600. The training process will be discussed in further detail below.

Via a skip connection, the output of an earlier iterative block is directly passed to one or more subsequent but not adjacent blocks. As such, the feature maps of the convolutional layers are concatenated. The use of skip connections (also called "dense connections" or "short connections") across the iterations strengthens feature propagation, making the network more robust, and a relatively deep architecture layers brings increased capacity.

Each of the plurality of iterative blocks 610, 620, 630, and 640 includes a data consistency (DC) unit (e.g., 612, 622, 632, 642) and a convolutional unit for regularization (e.g., 614, 624, 634, 644). The data-consistency units utilize the acquired k-space data in PROPELLER blades 602 as a prior that keeps the network 600 from drifting away from the acquired data, and the convolutional units for regularization are trained to regularize the reconstruction. The iterative block 630 is used as an example to further illustrate the components, in FIG. 6A. The iterative block 630 includes a DC unit 632 and a convolutional unit for regularization 634. The DC unit 632 may further includes an DC main unit for the main contrast, an DC S1 unit for the first supporting contrast, and an DC S2 unit for the second supporting contrast.

Figure 6B:
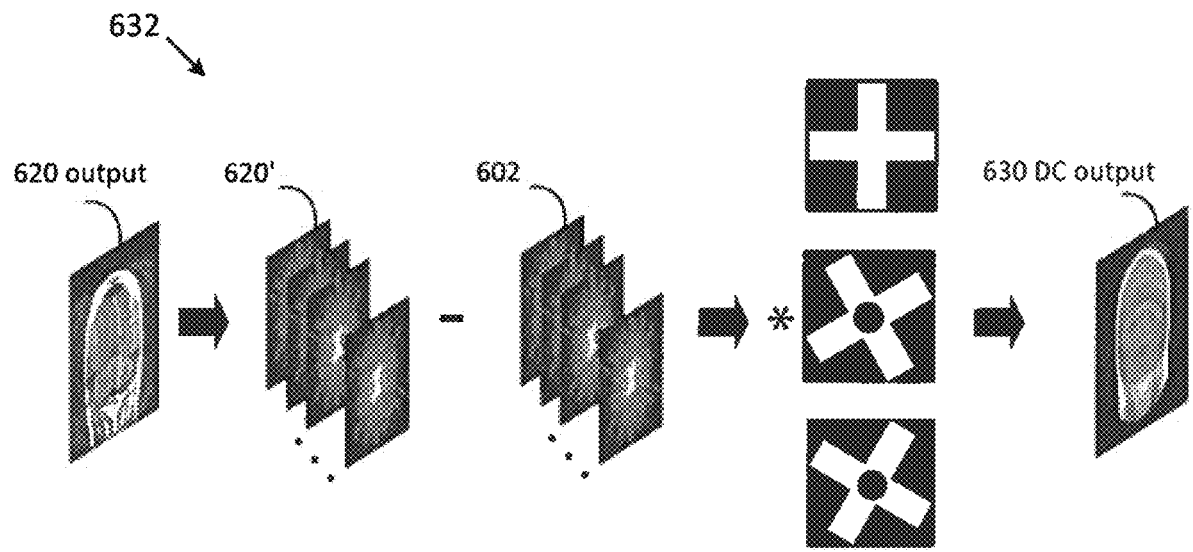
FIG. 6B is a schematic diagram of a data consistency unit in the deep neural network of FIG. 6A.

Referring to FIG. 6B, a schematic diagram shows the process performed by the DC unit 632, in accordance with an exemplary embodiment. The DC unit 632 receives the output image from the preceding iterative block 620 and maps this output image to k-space data in PROPELLER blades 620', using for example, non-uniform fast Fourier transform. The mapped k-space data in blades 620' are then compared with the acquired k-space data in blades 602. Masks (e.g., masks 521, 522, 523 in FIG. 5) are then applied to the difference (or inconsistency) between the mapped k-space data and measured k-space data. As discussed above, for the first and second supporting contrasts, the difference between the mapped k-space data and the measured k-space data in the middle area (e.g., the central circle 209) of k-space is removed so that the supporting contrasts do not go into the final image of the main contrast. As such, for the main contrast, the difference in all frequency components is taken into account, but for the supporting contrasts, the difference in low frequency components are removed while the difference in high frequency components remains.

The masked difference is then combined according to respective weights—$\lambda_{main}$ for main contrast, $\lambda_{s1}$ for the first supporting contrast, and $\lambda_{s2}$ for the second supporting contrast. In some embodiments, weights $\lambda_{main}$, $\lambda_{s1}$, and $\lambda_{s2}$ are learned parameters through training of the network 600. The combined difference is transferred back to the image space by using, for example, inverse Fourier Transform. The 630 DC unit output image reflects the gap to the measurements in real space. By utilizing the acquired k-space data 602 as a prior, the DC unit 632, embedded as operations inside the iterative block 630, keeps the network 600 from drifting away from the acquired data 602. For this use, the acquired k-space data 602 are input directly into each DC unit of the network 600. Each iteration contains a DC unit that operates only on the iteration's direct input image.

Figure 6C:
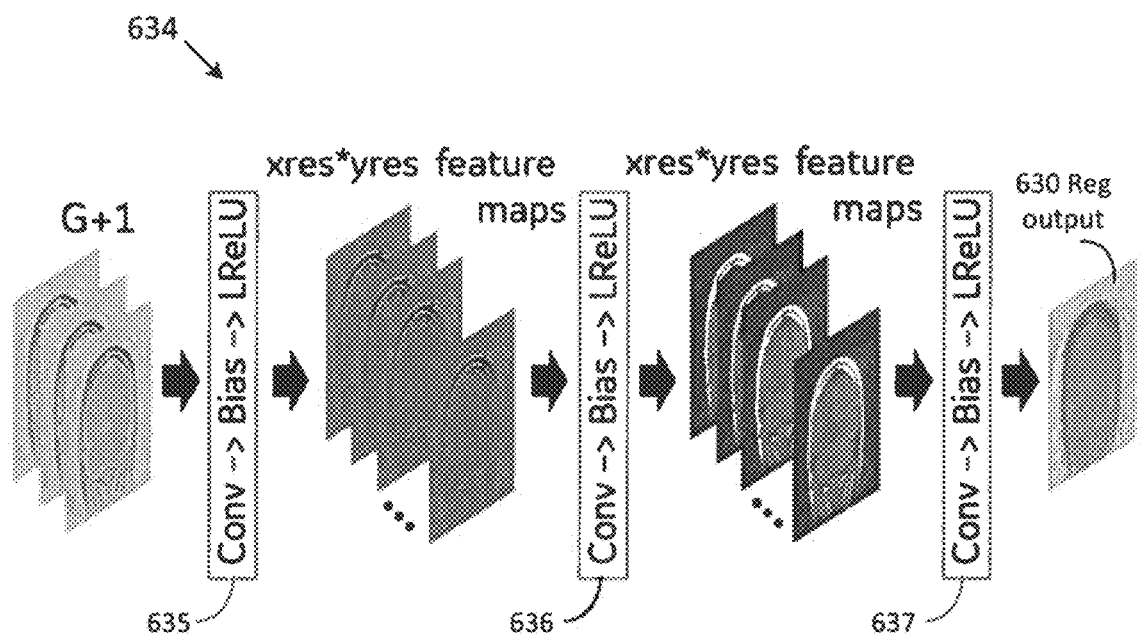
FIG. 6C is a schematic diagram of a convolutional unit for regularization in the deep neural network of FIG. 6A.

Referring to FIG. 6C, a schematic diagram shows the process performed by the convolutional unit for regularization 634, in accordance with an exemplary embodiment. The regularization unit 634 includes a plurality of convolutional layers. In FIG. 6C, three convolutional layers 635, 636, and 637 are shown, each consisting of convolution (e.g., 5×5 convolution), bias, and rectified linear unit (e.g., leaky rectified linear unit (LReLU)). It should be understood that the regularization unit may include any appropriate number of convolutional layers. Input to the regularization unit 634 consists of the output image from the adjacent preceding iterative block through the direct connection and G output images from non-adjacent preceding iterative blocks through skip connection. The convolution has a plurality of filters configured to generate a plurality of features maps based on the input images. The bias generates a plurality of biased output feature maps. The ReLU generates the output image(s) based on the plurality of biased output feature maps. The regularization unit 634 is able to propagate features across multiple iterative blocks to generate regularization information. In some embodiments, the regularization information is representative of the smoothness of the cost function (1) in the minimization problem. For example, the regularization information may be R(u) in the cost function (1). The regularization unit 634 uses the regularization information to reduce the generalization error in the output of the iterative block 630. The regularization unit 634 includes parameter values, such as those for filters for convolution, bias values, and activation layer values, which are learned during training of the network 600.

The output from the DC unit 632 is subtracted from the output from the regularization unit 634. The difference is the output of the iterative block 630, which is input to the subsequent iterative blocks.

In some embodiments, the network 600 is a deep independent reconstruction network (DIRN), which uses separate parallel networks to reconstruct each contrast with each network a DCI-Net architecture (or other convolutional network architecture). In some embodiments, the network 600 is a deep feature sharing network (DFSN), which applies a feature sharing strategy for multi-contrast reconstruction.

The deep neural network 600 may be trained before being put in use. Images reconstructed from full k-space data sampled by PROPELLER can be used as the ground truth. For example, for each of the multiple contrasts, a PROPELLER sequence is performed to sample the full k-space for the same anatomy. The full k-space data is retrospectively undersampled by discarding some blades to generate the corresponding undersampled k-space data, for training.

The output from the final iteration of the network 600 is compared to the fully sampled ground truth reference image to compute some loss or error function, which is backpropagated to guide the network training. The loss or error function measures the difference between the network output and the training target. In some embodiments, the loss function may be the Mean-Squared Error (MSE) of the voxel-level or pixel-level or partial-line-integral values and/or may account for differences involving other image features, such as image gradients or other image statistics. Alternatively, the loss function can be defined by other metrics associated with the particular task in question, such as a Structural Similarity (SSIM) index.

Figure 7:
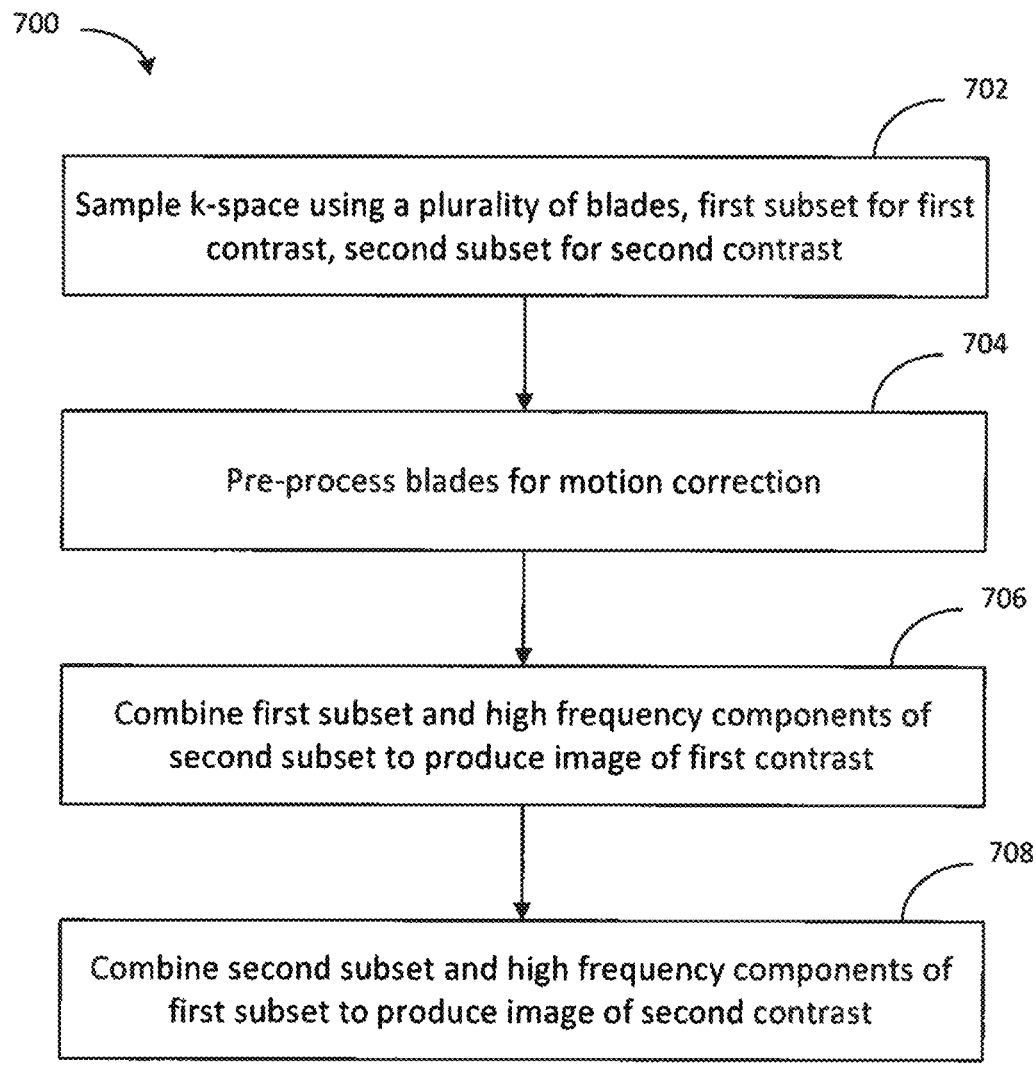
FIG. 7 is a flow chart of a method for obtaining multi-contrast images by using accelerated PROPELLER, in accordance with an exemplary embodiment.

Referring to FIG. 7, a flow chart 700 of a method for obtaining multi-contrast images by using accelerated PROPELLER is shown, in accordance with an exemplary embodiment. The method can be performed by an MRI system, e.g., the MRI system 100 shown in FIG. 1. In some embodiments, at least some operations of the method can be performed at a device separate from the MRI system, or at cloud, or by any combination thereof. At an operation 702, k-space is sampled in a rotating fashion using a plurality of radially directed blades around the center of k-space. Among the plurality of blades, a first subset of blades is acquired for a first contrast and a second subset of blades is acquired for to a second contrast. In some embodiments, more than two contrasts are acquired. For each contrast, k-space is undersampled.

At an operation 704, the sampled k-space data in the plurality of blades are pre-processed for motion correction. In some embodiments, the pre-processing may include phase correction, rotation correction, translation correction, and correlation weighting. The corrected blades may be gridded onto a set of Cartesian coordinates defined for k-space.

At an operation 706, the first subset of blades and the high-frequency components of the second subset of blades are combined to produce an image of the first contrast. By removing the low frequency components of the second subset of blades from the reconstruction, information of the second contrast is not included in the image of the first contrast. In some embodiments, the low frequency components are k-space samples in the central circle of k-space while the high frequency components are k-space samples outside of the central circle.

In some embodiments, the combination of k-space data from different subsets of blades for different contrasts may be solved as a minimization problem for a penalized weighted least squares cost function, e.g., the cost function of formula (1). In some embodiments, minimization of the cost function may be iteratively solved by analytical methods. In particular, an estimated image is mapped to the blades in k-space, using, for example, nonuniform fast Fourier Transform. The difference of mapped k-space data and acquired k-space data is calculated for each blade. Masks are applied to the difference so that the difference in the middle area is removed for the second contrast. Then the masked difference is combined with weights. In some embodiments, the difference in the first contrast is weighted more than the difference in the second contrast. The combined difference in k-space data is then transformed back to the image space and used to correct the estimated image with a regularization function. In some embodiments, the regularization function is the summation, over all pixels/voxels in the image, of the sum of squared intensity differences between a pixel and its 4 neighboring pixels or between a voxel and its 8 neighboring pixels. The iteration goes on until a pre-defined number of iterations are performed or a desired convergence is achieved.

In some embodiments, minimization of the cost function may be solved by using a deep neural network. In some embodiments, a DCI-Net is used. The deep neural network consists of a plurality of iterative blocks, each iterative block having a data consistency unit and a convolutional unit for regularization. The data consistency unit maps the output image from the adjacent preceding iterative block to the blades in k-space, using, for example, nonuniform fast Fourier Transform and calculates the difference between the mapped k-space data and acquired k-space data for each blade. Masks are applied to the difference so that the difference in the middle area is removed for the second contrast. Then the data consistency unit combines the masked difference with weights. The weights are learned parameters through training of the network.

The convolutional unit for regularization includes a plurality of convolutional layers. The output image from the adjacent preceding iterative block and output images from non-adjacent preceding iterative blocks may be input to the convolutional unit, which generates regularization information. In some embodiments, the regularization information is representative of the smoothness of the cost function in the minimization problem. The regularization unit uses the regularization information to reduce the generalization error in the output of the corresponding iterative block. The regularization unit includes parameter values, such as those for filters for convolution, bias values, and activation layer values, which are learned during training of the network. The output from the data consistency unit is subtracted from the output from the regularization unit. The difference is the output of the iterative block, which is input to subsequent iterative blocks.

At an operation 708, similarly, the second subset of blades and the high-frequency portion of the first subset of blades are combined to produce an image of the second contrast.

Figure 8:
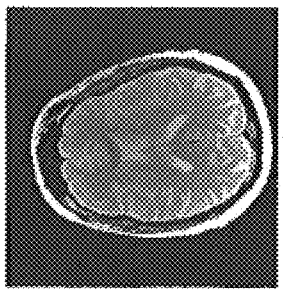
FIG. 8 shows multi-contrast PROPELLER images with an acceleration factor of 2 in comparison with images obtained by other techniques, in accordance with an exemplary embodiment.
Figure 8:
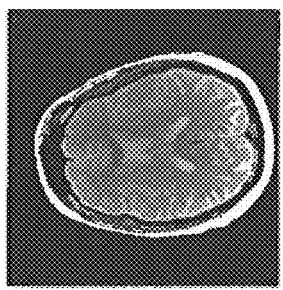
Figure 8:
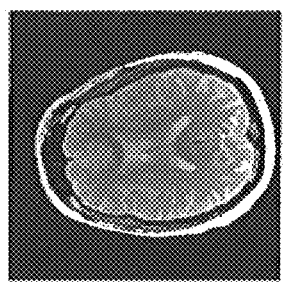
Figure 8:
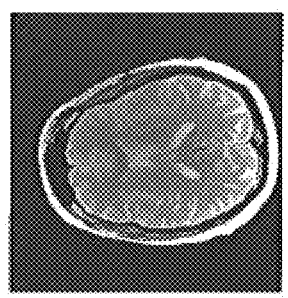
Figure 8:
Figure 8:
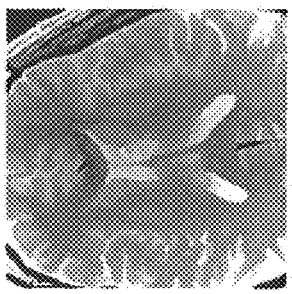
Figure 8:
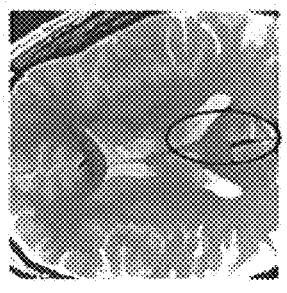
Figure 8:
Figure 8:
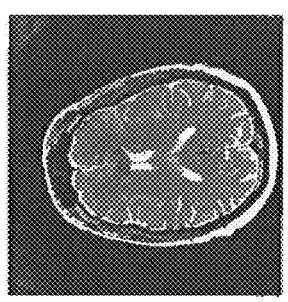
Figure 8:
Figure 8:
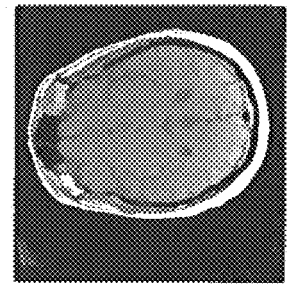
Figure 8:
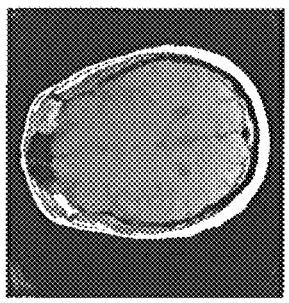

Referring to FIG. 8, multi-contrast images generated by accelerated PROPELLER as discussed above with an acceleration factor of 2 are shown in comparison with images generated by other techniques, in accordance with an exemplary embodiment. 8-1*a* is a ground truth PD-weighted image reconstructed from full k-space data sampled by PROPELLER. 8-1*b* is a PD-weighted image produced by the accelerated PROPELLER discussed in this disclosure with a trained DCI-Net. K-space is sampled with PROPELLER blades for various contrasts. 8-1*c* is a PD-weighted image reconstructed from undersampled k-space data with a trained DCI-Net. Only blades for PD-weighted contrast are used in the reconstruction. 8-1*d* is a PD-weighted image reconstructed from undersampled k-space data with zero filling. FIGS. 8-2*a* through 8-2*d* are zoom-in images for FIGS. 8-1*a* through 8-2*d*, respectively. Streaks are observed in FIGS. 8-2*c* and 8-2*d*, but not 8-2*b*, which suggests that accelerated PROPELLER has reduced artifacts. 8-3*a* is a ground truth T2-weighted image reconstructed from full k-space data sampled by PROPELLER. 8-3*b* is a T2-weighted image produced by the accelerated PROPELLER discussed in this disclosure with a trained DCI-Net. 8-4*a* is a ground truth T1-weighted image reconstructed from full k-space data sampled by PROPELLER. 8-4*b* is a T1-weighted image produced by the accelerated PROPELLER discussed in this disclosure with a trained DCI-Net. It can be seen that images produced by accelerated PROPELLER are very close to the ground truth reference pictures.

Figure 9:
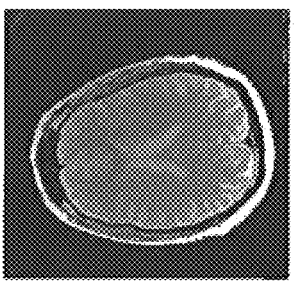
FIG. 9 shows multi-contrast PROPELLER images with an acceleration factor of 3 in comparison with images obtained by other techniques, in accordance with an exemplary embodiment.
Figure 9:
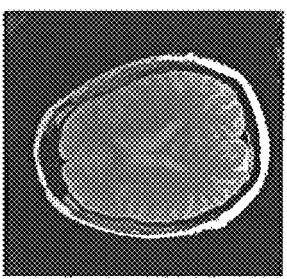
Figure 9:
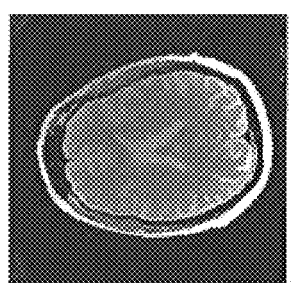
Figure 9:
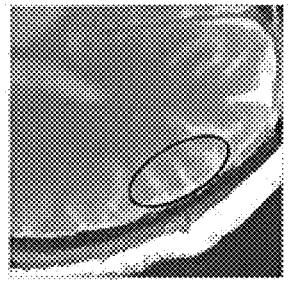
Figure 9:
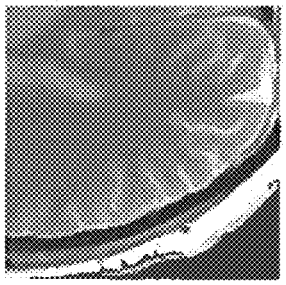
Figure 9:
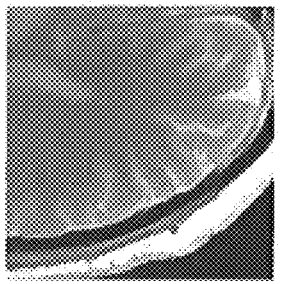
Figure 9:
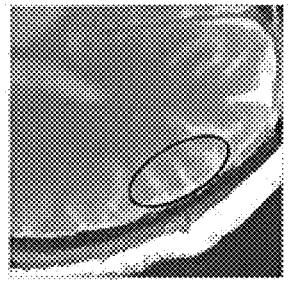
Figure 9:
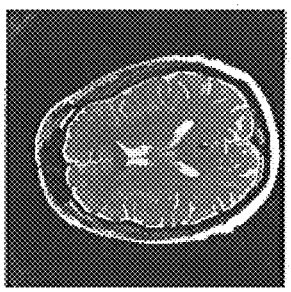
Figure 9:
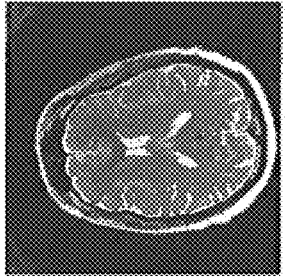
Figure 9:
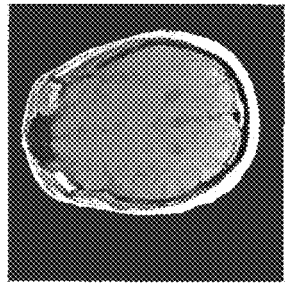
Figure 9:
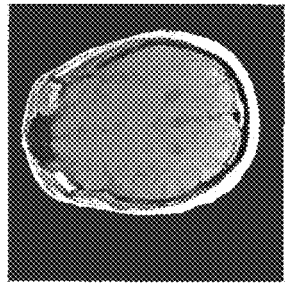

Referring to FIG. 9, multi-contrast images generated by accelerated PROPELLER with an acceleration factor of 3 are shown in comparison with images generated by other techniques, in accordance with an exemplary embodiment. Similar to FIG. 8, FIG. 9 shows that accelerated PROPELLER has reduced artifacts and it is able to produce high quality images.

In addition to any previously indicated modification, numerous other variations and alternative arrangements may be devised by those skilled in the art without departing from the spirit and scope of this description, and appended claims are intended to cover such modifications and arrangements. For example, PROPELLER converges to radial imaging when the number of phase encoding lines in each blade is reduced to one (1). The present disclosure can be applied to radial imaging with few modifications. For the simplicity of description, we use PROPELLER here to cover the radial imaging scenario as well.

Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, the examples and embodiments, in all respects, are meant to be illustrative only and should not be construed to be limiting in any manner.

What is claimed is:

1. A method for multi-contrast magnetic resonance imaging, the method comprising:
sampling k-space in a rotating fashion using a plurality of radially directed blades around a center of k-space, wherein a first subset of blades is acquired for a first contrast and a second subset of blades are acquired for a second contrasts;
combining the first subset of blades and high frequency components of the second subset of blades to produce an image of the first contrast; and
combining the second subset of blades and high frequency components of the first subset of blades to produce an image of the second contrast.

2. The method of claim 1, wherein the first subset of blades is acquired with scan parameters set according to the first contrast, the second subset of blades are acquired with scan parameters set according to the second contrast.

3. The method of claim 1, further comprising pre-processing the plurality of blades for motion correction.

4. The method of claim 1, wherein the high frequency components are located outside of a central circle of k-space, the central circle having a diameter equal to the width of each of the plurality of blades.

5. The method of claim 1, wherein combining the first subset of blades and high frequency components of the second subset of blades to produce the image of the first contrast comprises iteratively solving a minimization problem for a penalized weighted least squares cost function.

6. The method of claim 1, wherein iteratively solving the minimization problem comprises, at each iteration:
mapping an estimated image to k-space data;
computing difference between the mapped k-space data and k-space data acquired by using the plurality of blades;
applying masks to the difference to remove the difference in low frequency components of the second subset of blades;
combining difference in the first contrast and difference in the second contrast with a first weight associated with the first contrast and a second weight associated with the second contrast;
transforming the combined difference back to a correction image;
correcting the estimated image with the correction image and a regularization function.

7. The method of claim 6, wherein the regularization function is a summation, over all pixels or voxels in the estimated image, of a sum of squared intensity difference between a pixel or voxel and its neighboring pixels or voxels.

8. The method of claim 6, wherein the minimization problem is solved by an analytical method.

9. The method of claim 6, wherein the minimization problem is solved by a deep neural network.

10. The method of claim 9, wherein the first weight and second weight are learned during training of the deep neural network.

11. A processing system for multi-contrast magnetic resonance imaging, the processing system comprises:
a storage device storing instructions; and
a processor coupled to the storage device and when executing the instructions, performing operations of:
instructing a magnetic resonance imaging (MRI) scanner to sample k-space in a rotating fashion using a plurality of radially directed blades around a center of k-space, wherein a first subset of blades is acquired for a first contrast and a second subset of blades are acquired for a second contrasts;
combining the first subset of blades and high frequency components of the second subset of blades to produce an image of the first contrast; and combining the second subset of blades and high frequency components of the first subset of blades to produce an image of the second contrast.

12. The processing system of claim 11, wherein the processor, when executing the instructions, further performs operations of pre-processing the plurality of blades for motion correction.

13. The processing system of claim 11, wherein combining the first subset of blades and high frequency components of the second subset of blades to produce the image of the first contrast comprising iteratively solving a minimization problem for a penalized weighted least squares cost function, which comprises, at each iteration:
mapping an estimated image to k-space data;
computing difference between the mapped k-space data and k-space data acquired by using the plurality of blades;
applying masks to the difference to remove the difference in low frequency components of the second subset of blades;
combining difference in the first contrast and difference in the second contrast with a first weight associated with the first contrast and a second weight associated with the second contrast;
transforming the combined difference back to a correction image;
correcting the estimated image with the correction image and a regularization function.

14. The processing system of claim 13, wherein the storage device further stores a trained deep neural network, and the processor utilizes the trained neural network to iteratively solve the minimization problem.

15. The processing system of claim 14, wherein the deep neural network is a densely connected iterative network (DCI-Net).

16. The processing system of claim 15, wherein the DCI-Net comprises a plurality of iterative blocks, each iterative block having a data consistency unit and a convolutional unit for regularization, wherein the data consistency unit utilizes the sampled k-space data as a prior to keep the network from drifting away from the sampled k-space data, and the convolutional unit uses regularization information to reduce the generalization error.

17. The processing system of claim 16, wherein the first weight and second weight are learned during training of the deep neural network.

18. The processing system of claim 16, wherein parameters of the convolutional units for regularization are learned during training of the deep neural network.

19. A method for multi-contrast magnetic resonance imaging, the method comprising:
sampling k-space in a rotating fashion using a plurality of radially directed blades around a center of k-space, wherein the plurality of blades consists of a subset of blades acquired for a main contrast and at least two subsets of blades each acquired for a supporting contrast; and
combining the subset of blades for the main contrast and high frequency components of the at least two subsets of blades for the supporting contrasts to produce an image of the main contrast.

20. The method of claim 19, wherein the high frequency components are located outside of a central circle of k-space, the central circle having a diameter equal to the width of each of the plurality of blades.

21. The method of claim 19, wherein combining the subset of blades for the main contrast and high frequency components of the at least two subsets of blades for the supporting contrasts comprises iteratively solving a minimization problem for a penalized weighted least squares cost function with a trained deep neural network.

22. The method of claim 19, wherein the main contrast and the supporting contrasts are any combination of the following: proton density-weighted contrast, T1-weighted contrast, T2-weighted contrast, T1-FLAIR contrast, and T2-FLAIR contrast.

* * * * *